United States Patent [19]

Uchiyama et al.

[11] Patent Number: 5,684,315
[45] Date of Patent: Nov. 4, 1997

[54] SEMICONDUCTOR MEMORY DEVICE INCLUDING MEMORY CELLS EACH HAVING AN INFORMATION STORAGE CAPACITOR COMPONENT FORMED OVER CONTROL ELECTRODE OF CELL SELECTING TRANSISTOR

[75] Inventors: Hiroyuki Uchiyama, Higashimurayama; Yoshiyuki Kaneko, Kokubunji; Hiroki Soeda, Katsuta; Yasuhide Fujioka, Fuchu; Nozomu Matsuda, Akishima; Motoko Sawamura, Higashimurayama, all of Japan

[73] Assignees: Hitachi, Ltd., Tokyo; Hitachi Instruments Engineering Co., Ltd., Katsuta; Hitachi ULSI Engineering Corporation, Tokyo; Hitachi Hokkai Semiconductor, Ltd., Kameda-gun, all of Japan

[21] Appl. No.: 362,879

[22] Filed: Dec. 23, 1994

[30] Foreign Application Priority Data

Dec. 28, 1993 [JP] Japan ................................. 5-336519

[51] Int. Cl.$^6$ ................. H01L 27/108; H01L 29/94; H01L 31/062; H01L 31/113
[52] U.S. Cl. ............. 257/306; 257/295; 257/296; 257/307; 257/308; 257/310; 257/311
[58] Field of Search ......................... 257/295, 306, 257/307, 308, 310, 311, 296

[56] References Cited

U.S. PATENT DOCUMENTS

| | | | |
|---|---|---|---|
| 4,985,718 | 1/1991 | Ishijima | 257/306 |
| 5,099,305 | 3/1992 | Takenaka | 257/295 |
| 5,172,201 | 12/1992 | Suizu | 257/308 |
| 5,223,729 | 6/1993 | Kudoh et al. | 257/296 |
| 5,305,256 | 4/1994 | Tanigawa | 257/296 |
| 5,309,392 | 5/1994 | Ootsuka et al. | |
| 5,396,456 | 3/1995 | Liu et al. | 257/308 |
| 5,475,248 | 12/1995 | Takenaka | 257/310 |
| 5,481,127 | 1/1996 | Ogawa | 257/308 |

FOREIGN PATENT DOCUMENTS

| | | | |
|---|---|---|---|
| 60-231357 | 11/1985 | Japan . | |
| 63-133565 | 6/1988 | Japan | 257/307 |
| 249471 | 2/1990 | Japan . | |
| 582750 | 4/1993 | Japan . | |

*Primary Examiner*—Mahshid D. Saadat
*Assistant Examiner*—Alice W. Tang
*Attorney, Agent, or Firm*—Antonelli, Terry, Stout & Kraus, LLP.

[57] ABSTRACT

A semiconductor memory device has memory cells provided at intersections between word line conductors and data line conductors. Each of the memory cells includes a cell selecting transistor and an information storage capacitor. The capacitor in each of the memory cells includes a first capacitor component formed over the control electrode of the transistor and a second capacitor component formed over a word line conductor which is adjacent to a word line conductor integral with the control electrode of the transistor. Each of the first and second capacitor components has a common electrode, a storage electrode and a dielectric film sandwiched therebetween, and the storage electrode is at a level higher than the common electrode in each of said first and second capacitor components. The storage electrodes of the first and second capacitor components are electrically connected with each other and with one of the semiconductor regions of the transistor. The other semiconductor region of the transistor is electrically connected with one of the data line conductors. Patterning of the storage electrodes of the first and second capacitor components is preferalbly effected by use of masks of a stripe pattern.

13 Claims, 12 Drawing Sheets

A-A

B-B

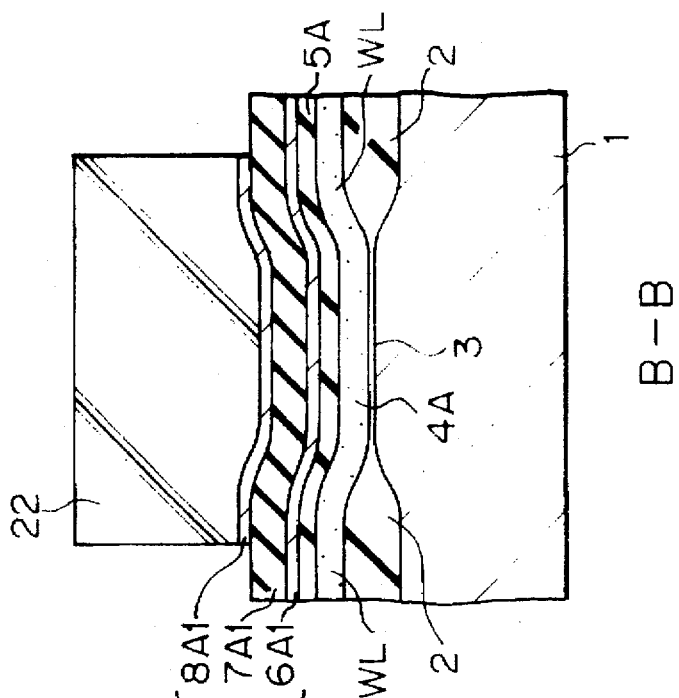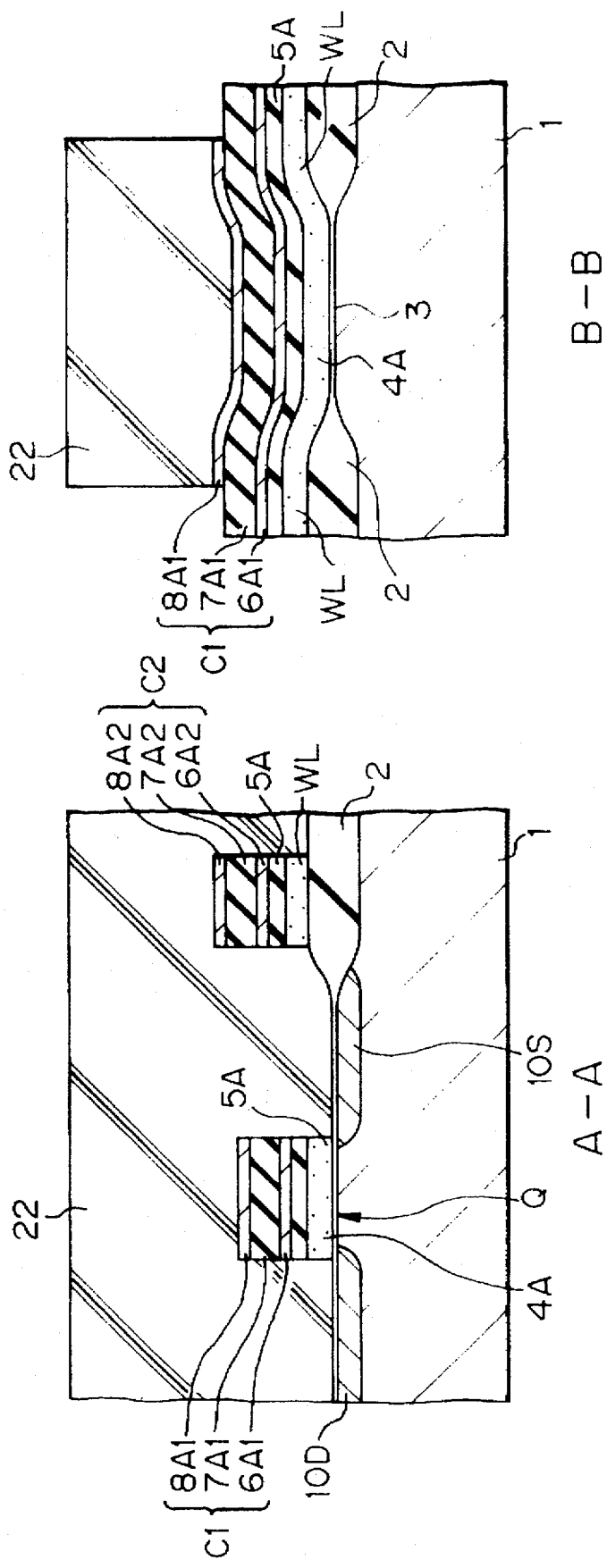

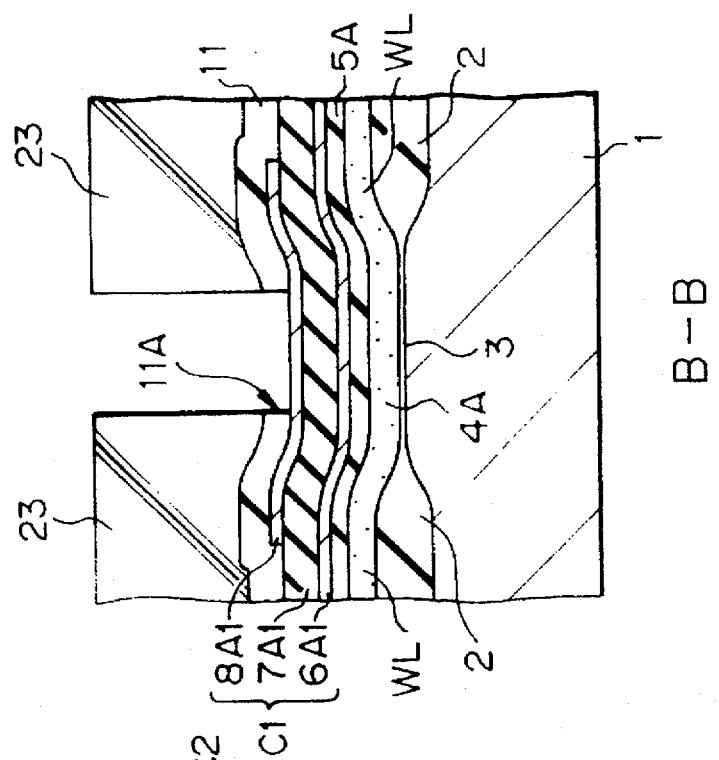
FIG. IIA
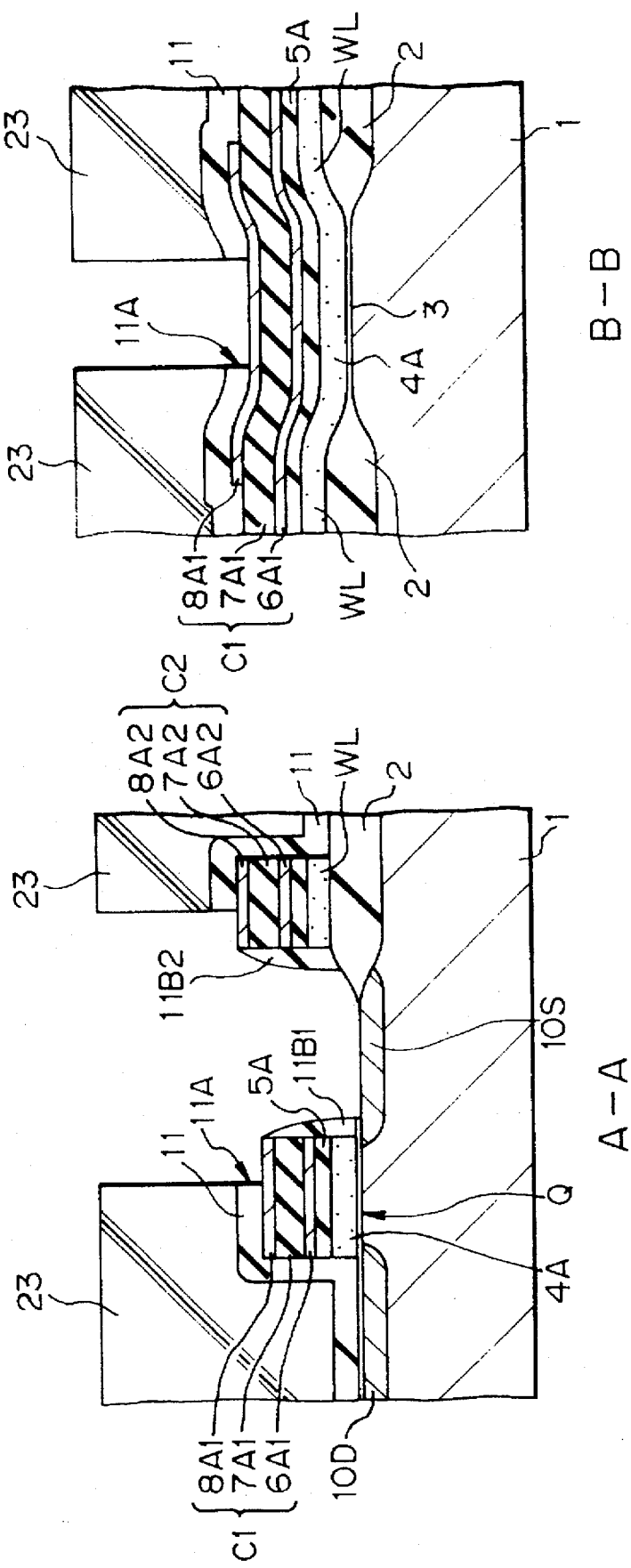
FIG. IIB

SEMICONDUCTOR MEMORY DEVICE INCLUDING MEMORY CELLS EACH HAVING AN INFORMATION STORAGE CAPACITOR COMPONENT FORMED OVER CONTROL ELECTRODE OF CELL SELECTING TRANSISTOR

BACKGROUND OF THE INVENTION

The present invention relates to a semi-conductor memory device, and more in particular, to a technique effectively applied to a semiconductor memory device having memory cells each including a series circuit of a memory cell selecting transistor and an information storage capacitor.

DRAMS (Dynamic Random Access Memory, hereinafter referred to simply as "DRAM") are well known as semiconductor memory devices. Each memory cell of a DRAM includes a series circuit of a memory cell selecting MISFET (Metal Insulator Semiconductor Field Effect Transistor) and an information storage capacitor to store information of one bit. The memory cells are arranged at intersections between the word lines extending, for example, in a column direction (Y direction) and data lines extending in a row direction (X direction) in a memory cell array. The memory cell selecting MISFET of a memory cell has one of the semiconductor regions thereof (e.g., the source or drain) connected to a data line, the other semiconductor region thereof connected to the storage electrode of an information storage capacitor, and the gate electrode thereof connected (integrally) with a word line.

In recent years, with the reduction in cell size (occupied area) along the plane of the memory cell due to the high integration of DRAM, it has become increasingly difficult to secure storage electric charges in an information storage capacitor. In view of this, as a technique for solving this technical problem, JP-A-60-231357 laid open Nov. 16, 1985 discloses a memory cell of STC structure (stacked structure) formed with an information storage capacitor over a memory cell selecting MISFET. Also, JP-A-5-82750 laid open Apr. 2, 1993 discloses a memory cell in which the storage electrode of each information storage capacitor is configured in the form of a fin or a crown as a technique for realizing the next-generation of high integration. The storage electrode and the common plate electrode of this information storage capacitor are formed in a process independent of the processes for forming the word lines or the data lines. On the other hand, the pattern of the storage electrodes on a plane (the shape of the storage electrodes projected on a plane) is basically determined by a single photolithographic process and a single etching process.

Further, JP-A-2-49471 laid open Feb. 19, 1990 discloses a memory cell including a dielectric film formed of a ferroelectric material made of, for example, lead zirconate titanate, as another technique developed for realizing the next-generation of high integration. The dielectric film formed of this ferroelectric material has a charge storage capacity (per unit area) approximately ten times as large as that of the dielectric film formed of silicon oxide or silicon nitride film.

The above-mentioned ferroelectric material has a relatively low step coverage capability during deposition, and therefore, requires a flat portion with a comparatively small amount of unevenness. When a dielectric film of an information storage capacitor is formed of a ferroelectric material, a flat portion is required to be secured in the memory cell. Therefore, the size along the flat portion of the memory cell increases, resulting in a reduced degree of integration of the DRAM (semiconductor integrated circuit device).

Also, the low step coverage capability during deposition of the ferroelectric film requires a thickness of the ferroelectric film larger than a predetermined thickness in order to suppress the leakage current in the capacitor when an information storage capacitor is formed at an uneven portion in the memory cell. In the case where the dielectric film of the information storage capacitor is formed of a ferroelectric material, therefore, the relative unevenness increases between the memory cell forming region for the information storage capacitor and the peripheral circuit forming region for the peripheral circuits. Thus, it becomes difficult to provide the wiring conductors over the capacitor, resulting in a reduced DRAM yield.

In the DRAM fabrication process, the planar shape (planar projection style) of the storage electrode of the information storage capacitor (the shape of the electrode projected on a plane) is defined in a single etching process. The corners of a storage electrode are rounded by the diffraction of light irradiated for forming an etching pattern. Hence, the flat area of a storage electrode is reduced, thereby decreasing the storage charges in the information storage capacitor. The decrease of storage charges implies a deterioration of refresh and other characteristics.

In the DRAM fabrication processes, the gate electrode of the memory cell selecting MISFET, the storage electrode of the information storage capacitor and the common electrode shared by the memory cells are formed in steps which are independent of each other. In order to prevent malfunction such as the shorting due to mask mis-alignment (for example, shorting between the bit line contact and the common electrode), the mask alignment size is added to the gate electrode, the storage electrode and the common electrode. The size of the flat area of the memory cell is thus increased, again decreasing the degree of DRAM integration.

Also, the memory cell having an information storage capacitor with a storage electrode formed in the shape of a fin or a crown leads to an increased number of fabrication steps in the DRAM fabrication process, thereby deteriorating the yield of DRAM fabrication.

U.S. patent application Ser. No. 5,309,392 issued May 3, 1994 discloses a photosensitive non-volatile semi-conductor IC device including memory cells in which each of the memory cells has a capacitor element formed over a MISFET. The capacitor includes first and second electrodes and a ferroelectric layer sandwiched therebetween.

SUMMARY OF THE INVENTION

Accordingly, an object of the invention is to provide a technique capable of improving the degree of integration of a semiconductor memory device including memory cells each configured of a memory cell selecting transistor and an information storage capacitor in series.

Another object of the invention is to provide a technique capable of improving the yield of the semiconductor memory device described above.

Still another object of the invention is to provide a technique capable of increasing the electric capacity of the information storage capacitor of the semiconductor memory device described above.

Still another object is to provide an improved memory cell storage capacitor with a dielectric formed of ferroelectric material which does not suffer from the above-noted problems.

A further object of the invention is to provide a technique capable of improving the yield of the process for fabricating the semiconductor memory device described above.

The above and other objects, features and advantages will be made apparent by the detailed description taken in conjunction with the accompanying drawings.

According to one aspect of the present invention, in a semiconductor memory device comprising a semiconductor substrate, a plurality of word line conductors formed over the substrate and a plurality of data line conductors formed over the substrate generally perpendicularly to the word line conductors, and a plurality of memory cells each provided at an intersection between one of the word line conductors and one of the data line conductors and including a cell selecting transistor and an information storage capacitor, the transistor having a pair of semiconductor regions formed in a surface portion of the substrate and a control electrode formed over the surface portion of the substrate between the pair of semiconductor regions and integral with one of the word line conductors, in each of the memory cells, the capacitor includes a first capacitor component formed over the control electrode of the transistor and a second capacitor component formed over that one of said word line conductors which is adjacent to a word line conductor integral with the control electrode of the transistor, each of the first and second capacitor components having a common electrode, a storage electrode and a dielectric film (7A) sandwiched therebetween, the storage electrode being at a level higher than the common electrode in each of said first and second capacitor components, the storage electrodes of the first and second capacitor components being electrically connected with each other and with one of the semi-conductor regions of the transistor, and the other semiconductor region of the transistor is electrically connected with one of the data line conductors.

According to another aspect of the invention, an information storage capacitor component is arranged over the control electrode of a memory cell selecting transistor providing a flat portion in the memory cell, and hence the size of the memory cell along the planar direction can be reduced. As a result, the degree of integration of the semi-conductor integrated circuit device can be improved.

The arrangement of an information storage capacitor component over the control electrode of a memory cell selecting transistor providing a flat portion in the memory cell reduces the thickness of the dielectric film of the information storage capacitor component made of a ferro-electric material. The result is a reduced relative unevenness between the memory cell array forming region where the information storage capacitor component is arranged and the peripheral circuit forming region where the peripheral circuits are arranged. The provision of the wiring conductors over the memory cell is thus facilitated for an improved yield of the semiconductor memory device.

According to another aspect of the invention, the unevenness between the control electrode of the memory cell selecting transistor and the word line conductor integral with the control electrode is comparatively gentle. Therefore, an information storage capacitor component can be formed over the control electrode and the word line conductor, thereby increasing the amount of storage charge of the memory cell.

According to a further aspect of the invention, an information storage capacitor component is arranged also over another word line conductor extending in one direction on the field insulating film adjacently with the control electrode of the memory cell selecting transistor. Thus, the charge storage of the memory cell can be secured in a required quantity.

According to a still further aspect of the invention, second electrodes (storage electrodes) of the information storage capacitor components typically have a planar shape (the shape of the capacitor components projected on a plane) thereof defined by two etching steps (since a mask of a stripe pattern is used). The corners of the second electrode can thus be prevented from rounding by light diffraction. As a result, the charge storage of the memory cell can be increased in quantity.

Also, the control electrode of the memory cell selecting transistor and the first and second electrodes of the two information storage capacitor components are formed by the same etching step, and therefore the mask alignment portions of the respective electrodes are no longer necessary. The cell size along the planar direction of the memory cell or the planar size of a cell can be reduced, thereby improving the degree of integration of the semiconductor memory device.

Further, as compared with the memory cell with the second electrode of the information storage capacitor components thereof formed in a fin or a crown, the number of fabrication steps can be reduced, and therefore the yield of fabrication process of the semi-conductor memory device is improved.

BRIEF DESCRIPTION OF THE DRAWINGS

FIGS. 5A, 5B, 6, 7A, 7B, 8, 9A, 9B, 10, 11A, 11B, 12A, 12B, 13, 14A, 14B and 15 are sectional views for explaining methods of fabricating the DRAM according to an embodiment of the invention.

DESCRIPTION OF THE PREFERRED EMBODIMENTS

Figure 1:
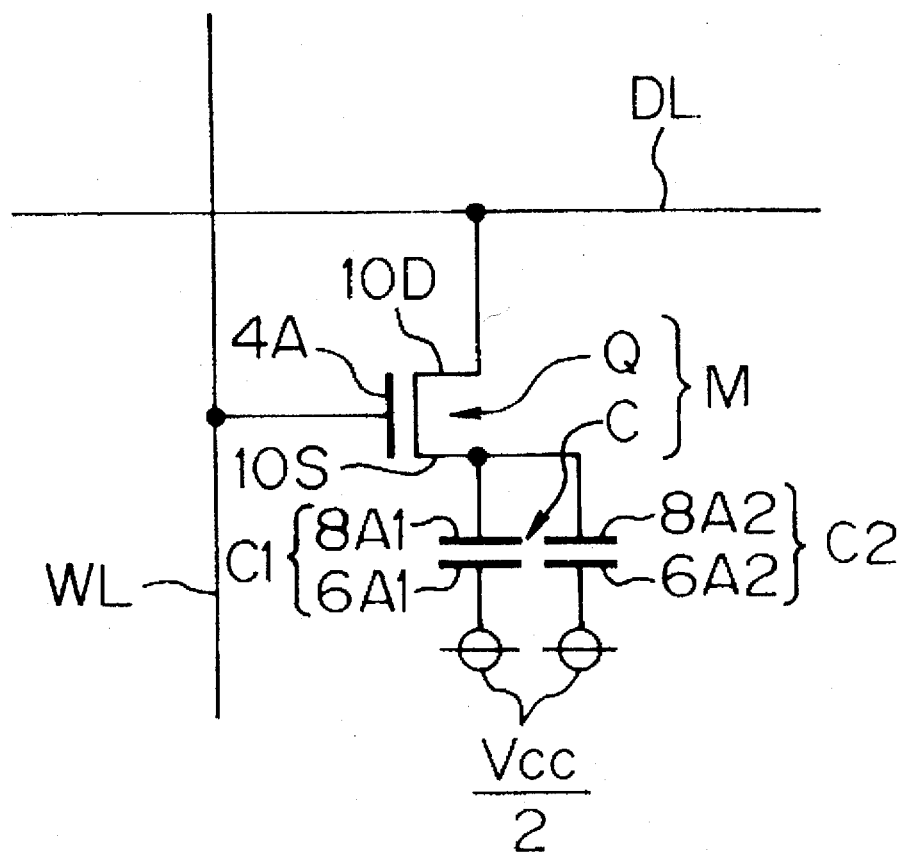
FIG. 1 is a diagram showing an equivalent circuit of the memory cell of the DRAM according to an embodiment of the invention.

The configuration of the present invention will be explained below with reference to embodiments thereof applied to the DRAMS.

In all the diagrams for explaining embodiments, the components having the same function are designated by the same reference numerals respectively and will not be described again.

Figure 2:
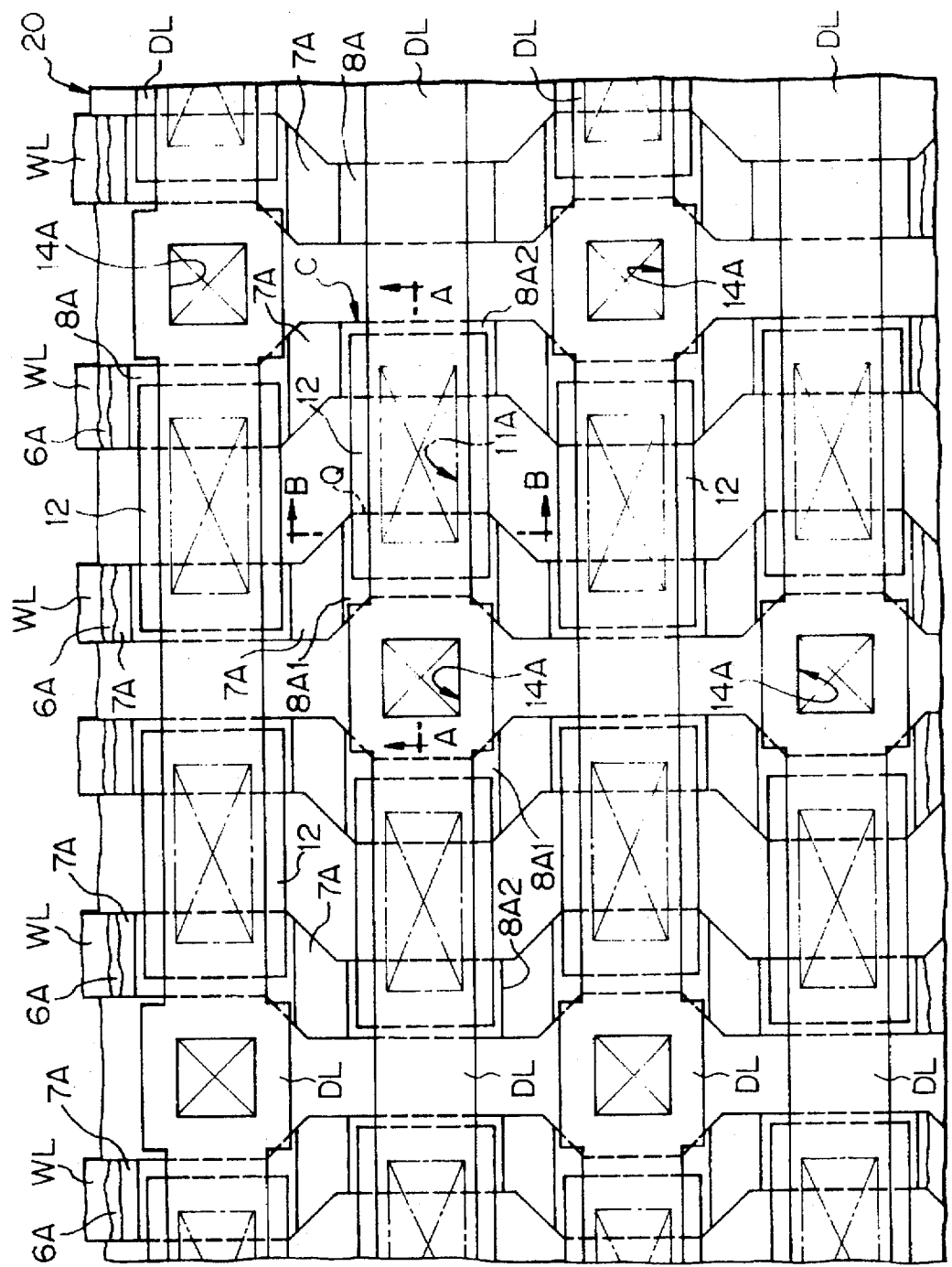
FIG. 2 is a plan view showing the essential parts of a memory cell array of the DRAM shown in FIG.1.

The general configuration of the DRAM according to an embodiment of the invention is shown in FIG.1 (an equivalent circuit of a memory cell) and FIG.2 (a plan view of the essential parts of a memory cell array).

As shown in FIG. 1, the memory cell M for storing the one-bit information of the DRAM is configured of a series circuit including a memory cell selecting transistor (such as MISFET (Metal Insulator Semiconductor FET)) Q and an information storage capacitor C. The capacitor C includes first and second capacitor components C1, C2 connected in parallel. This memory cell M is arranged at the intersection between the word line conductor WL extending along the column (Y direction) and the data line conductor (one of the complementary data lines) DL extending along the row (X direction).

The memory cell selecting MISFET Q of the memory cell M has one of the semiconductor regions thereof (e.g., the drain 10D) connected to the data line conductor DL, the other semiconductor region (e.g., the source 10S) connected to the first electrodes (storage electrodes 8A1, 8A2) of the information storage capacitor components C1, C2, and the gate electrode (4A) connected to the word line conductor WL. The second electrodes (common electrodes 6A1, 6A2) of the information storage capacitor components C1, C2 are connected to a fixed potential of, say, one half of Vcc (for example, about 2.5 V when the operating potential Vcc is 5 V).

A plurality of memory cells M, as shown in FIG. 2, are arranged in the direction in which the word line conductors WL extend along the column and the direction in which the data line conductors DL extend along the row, thereby making up a memory cell array 20. This memory cell array 20, though not shown, is arranged in a memory cell array forming region defined by the peripheral circuit forming region containing peripheral circuits including a word driver circuit, an X decoder circuit and a Y decoder circuit.

Now, a specific configuration of the n-channel MISFET Qn making up one memory cell M of the DRAM and the peripheral circuits will be explained with reference to FIGS. 2, 3A, 3B (sectional views of the memory cell M) and FIG. 4 (sectional view of the n-channel MISFET Qn).

Figure 3A:
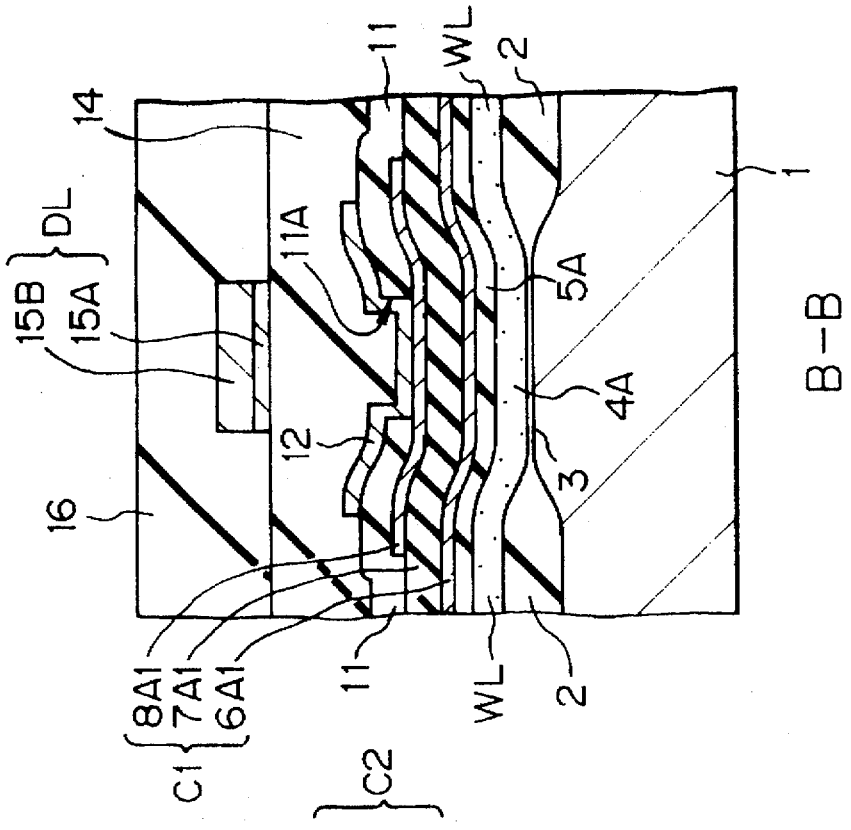
FIG. 3A and 3B are sectional views taken along lines A—A and B—B respectively in FIG.2.
Figure 3B:
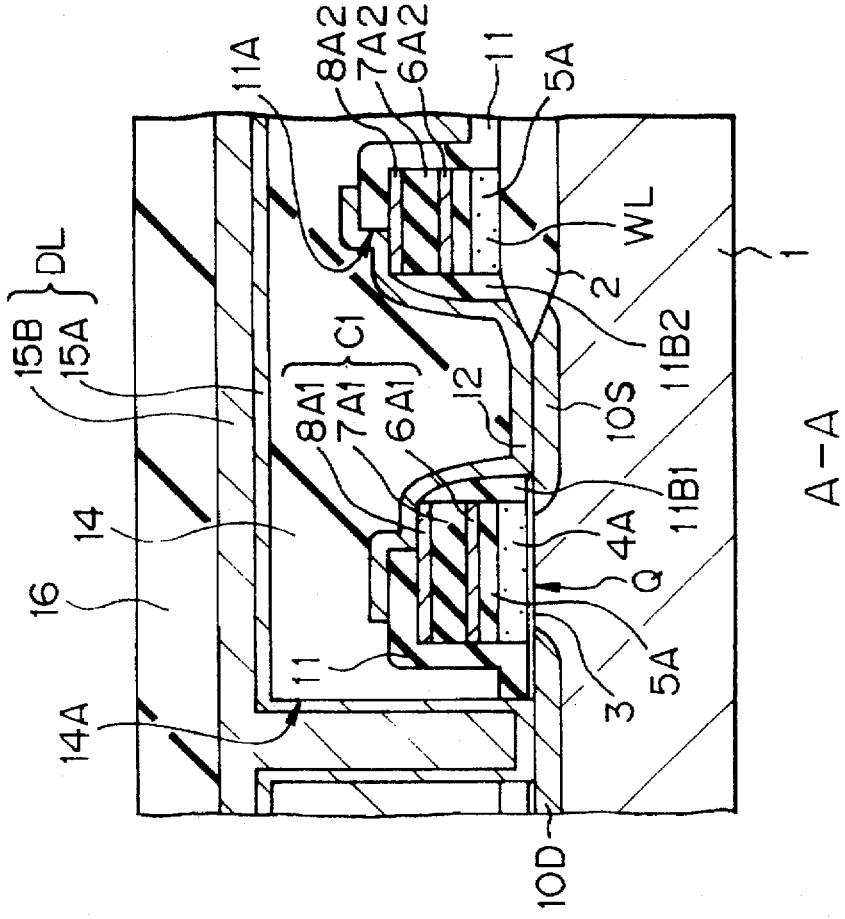

FIG. 3A is a sectional view taken along line A—A in FIG. 2, and FIG. 3B a sectional view taken along line B—B in FIG. 2.

As shown in FIGS. 2, 3A, 3B, the DRAM is made of a p-type semiconductor substrate 1 of single-crystal silicon, for example. The memory cells M are formed on the main surface of the memory cell array forming region of this p-type semiconductor substrate 1.

The memory cell selecting MISFET Q of the memory cell M is formed on the main surface of the element forming region, i.e., the active region of the p-type semiconductor substrate 1 with the periphery thereof defined by the field insulating film 2. This memory cell selecting MISFET Q principally includes a p-type semiconductor substrate (channel forming region) 1, a gate insulating film 3, a gate electrode 4A, and a pair of n-type semiconductor regions 10D, 10S making up the drain and the source respectively. In other words, the memory cell selecting MISFET Q is of n-channel conductivity type.

The gate insulating film 3 is formed on the main surface of the element forming region, i.e., the active region of the p-type semiconductor substrate 1 with the periphery thereof defined by the field insulating film 2. This gate insulating film 3 is formed of a thermally-oxidated silicon film, for example, in the thickness of about 12 nm. The gate electrode 4A is formed on the gate insulating film 3 and is made of a polycrystal silicon film doped with impurities (such as phosphorus) for reducing the resistance value. The gate electrode 4A extends on the gate insulating film 3 in the same direction as the word line conductor WL extending on the field insulating film 2, and is integrated with the word line conductor WL. More specifically, this gate electrode 4A is electrically connected to the gate electrodes 4A of the memory cell selecting MISFETs Q of other memory cells M arranged in the direction of extension of the word line conductor WL. A pair of n-type semiconductor regions 10D, 10S making up the drain and source are formed on the main surface (surface portions) of the active region of the p-type semiconductor substrate 1. The n-type semiconductor region 10D making up one of the n-type semiconductor regions 10D, 10S is electrically connected with the data line conductor DL through a contact hole 14A formed in the layer insulating film 14. This data line conductor DL is formed of a polycrystal silicon film 15A doped with impurities and a silicide film ($WSi_x$, $TaSi_x$, $TiSi_x$, $MoSi_x$) 15B deposited on the polycrystal silicon film 15A.

The field insulating film 2 is formed on the main surface of the non-active region of the p-type semiconductor substrate 1 and is used as an insulating film for element isolation. This field insulating film 2 is formed of, for example, a thermally-oxidized silicon film which is, in turn, formed by the well-known selective oxidation process in the thickness of, say, about 400 nm.

The gate electrode 4A of the memory cell selecting MISFET Q making up the flat portion in the memory cell has formed thereover an information storage capacitor component C1 through the insulating film 5A. This capacitor component C1 is configured in such a structure that the a common electrode (first electrode) 6A1, a dielectric film 7A1 and a storage electrode (second electrode) 8A1 are stacked on the surface of the insulating film 5A.

An information storage capacitor component C2 is formed over the word line conductor WL extending on the field insulating film 2 adjacently to the gate electrode 4A of the memory cell selecting MISFET Q. This capacitor component C2 has a structure similar to the capacitor component C1 formed over the gate electrode 4A of the memory cell selecting MISFET Q, and is configured in such a way that a common electrode 6A2, a dielectric film 7A2 and a storage electrode 8A2 are stacked on the insulating film 5A. The common electrodes 6A1, 6A2 and the storage electrodes 8A1, 8A2 of the capacitor components C1, C2 are formed respectively of Pt (platinum), for example. The dielectric film 7A1 is formed of a ferroelectric material of lead zirconate titanate, for example.

In the information storage capacitor components C1, C2, the common electrodes 6A1, 6A2 and the dielectric films 7A1, 7A2 are formed to have the same shape in the planar direction as the gate electrode 4A and the word line conductor WL, respectively. More specifically, the width, measured in the row direction (the direction in which the data line conductors DL extend), of the electrode 6A1 and the dielectric film 7A1 of the capacitor component C1 in the active region of the substrate 1 is defined to be substantially equal to the gate length of the gate electrode 4A. The width of the common electrode 6A2 and the dielectric film 7A2 of the capacitor component C2 in the non-active region of the substrate 1 is defined to be substantially equal to the width of the word line conductor WL. The width, measured in the row direction, of the storage electrode 8A1 of the capacitor component C1 is defined to be substantially equal to the gate length of the gate electrode 4A, and the width, measured in the row direction, of the storage electrode 8A2 of the capacitor component C2 is defined to be substantially equal to the width of the word line conductor WL. The length, measured in the column direction (the direction in which the word line conductors WL extend) of these storage electrodes 8A1, 8A2 is defined by a predetermined processing dimension (length), so that these storage electrodes 8A1, 8A2 are isolated from storage electrodes 8A1, 8A2 of capacitor components C1, C2 of capacitors C of other memory cells M arranged in the direction of extension of the word line conductors WL.

The storage electrodes 8A1, 8A2 of the information storage capacitor components C1, C2 are connected electrically with a connection electrode 12 through an opening 11A formed in the layer insulating film 11, while the other n-type semiconductor region 10S of the memory cell selecting MISFET Q is connected electrically with a connection electrode 12 through the opening 11A. This connection electrode 12 is electrically isolated from the gate electrode 4A of the memory cell selecting MISFET Q and the common electrodes 6A1, 6A2 of the capacitor components C1, C2 by means of side wall spacers 11B1, 11B2. The side wall spacer 11B1 is formed in such a manner as to cover a side surface of the gate electrode 4A of the other n-type semiconductor region 10S of the memory cell selecting MISFET Q and a side surface of the common electrode 6A1 of the capacitor component C1. The side wall spacer 11B2, on the other hand, is formed in such a manner as to cover a side surface of the common electrode 6A2 of the capacitor component C2 and a side surface of the word line conductor WL adjacent to the gate electrode 4A. The side surfaces where the side wall spacer 11B1 is formed are located in opposed relationship to the side surfaces where the side wall spacer 11B2 is formed.

The gate electrode 4A of each memory cell selecting MISFET Q extends along the column on the gate insulating film 3, and each word line conductor WL extends along the column on the field insulating film 2. The unevenness between the gate electrode 4A and the word line conductor WL is affected by the unevenness between the field insulating film 2 and the gate insulating film 3. In view of the fact that the unevenness between the field insulating film 2 and the gate insulating film 3 is at most about 0.2 μm, however, the unevenness between the gate electrode 4A and the word line conductor WL is comparatively gentle. In other words, the dielectric films 6A1, 6A2 made of a ferroelectric material low in step coverage during deposition can be formed continuously over the word line conductor WL including the gate electrode 4A. The dielectric films 6A1, 6A2 of the information storage capacitor components C1, C2 may be formed only under the upper electrodes, i.e., the storage electrodes 8A1, 8A2.

The storage electrode 8A2 of the capacitor component C2 is electrically connected to the other n-type semiconductor region 10S of the memory cell selecting MISFET Q through the above-mentioned connection electrode 12.

The data line conductor DL is covered with the layer insulating film 16. This layer insulating film 16, though not shown, is formed with upper level wiring conductors thereupon.

Figure 4:
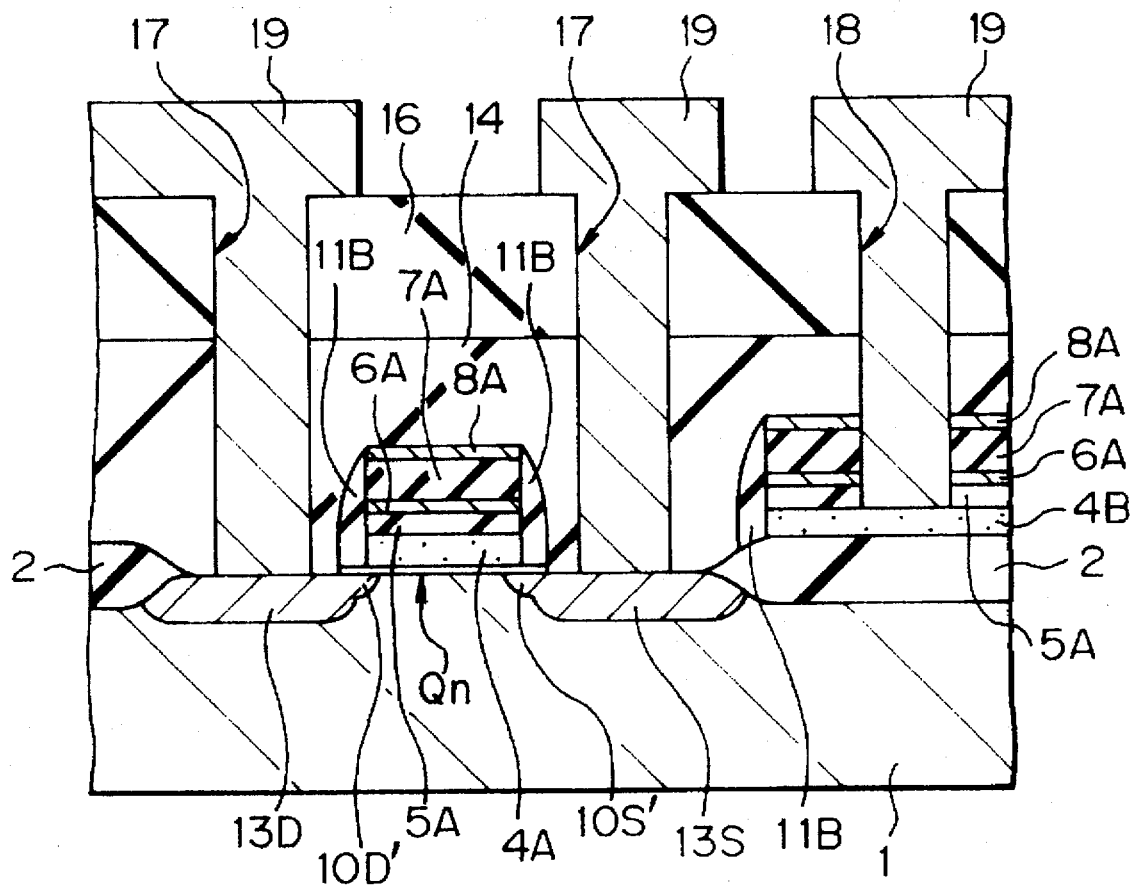
FIG. 4 is a sectional view showing an example of the periphery circuit forming region of the DRAM shown.

The n-channel MISFET Qn making up the peripheral circuits, as shown in FIG.4, is formed on the main surface of the active region of the p-type semiconductor substrate 1 with the periphery thereof defined by the field insulating film 2. This n-channel MISFET Qn mainly includes a p-type semiconductor substrate (channel forming region) 1, a gate insulating region 3, a gate electrode 4A, a pair of n-type semiconductor regions 10D', 10S' and a pair of n$^+$-type semiconductor regions 13D, 13S making up the source and drain, respectively. In other words, the n-channel MISFET Qn is configured of an LDD (Lightly Doped Drain) structure. A common electrode 6A, a dielectric film 7A and a storage electrode 8A are deposited through an insulating film 5A on the gate electrode 4A of the n-channel MISFET Qn and the gate wiring conductor 4B formed integrally with the gate electrode 4A.

Each of the n$^+$-type semiconductor regions 13D, 13S of the n-channel MISFET Qn is electrically connected with the wiring conductor 19 through the contact hole 17 formed in each of the layer insulating films 14 and 16 respectively. The gate wiring conductor 4B is electrically connected with the wiring conductors 19 through the contact hole 18 formed in each of the insulating film 5A, the common electrode 6A, the dielectric film 7A, the storage electrode 8A, the layer insulating film 14 and the layer insulating film 16. Though not shown in the drawings, the p-channel MISFET is also formed on the same substrate in order to constitute a CMOS (complementary MOS) circuit.

Now, a method of fabricating the DRAM will be explained with reference to FIGS. 5 to 15.

FIGS. 5A, 5B, 7A, 7B, 9A, 9B, 11A, 11B, 12A, 12B and 14A, 14B are sectional views for explaining the fabrication processes for the memory cell array forming region. In these diagrams, FIGS. 5A, 7A, 9A, 11A, 12A and 14A show the structure in each fabrication step of the parts shown in the sectional view of FIG. 3B. Also, FIGS. 6, 8, 10, 13 and 15 are sectional views showing the structure in each fabrication step for the peripheral circuit forming region.

First, the p-type semiconductor substrate 1 is prepared.

A field insulating film (first insulating film) 2 defining the active region (element forming region) is formed on the main surface of the p-type semiconductor substrate 1. The field insulating film 2 is formed of, for example, a thermally oxidated silicon film deposited by the well-known selective thermal oxidation process. This field insulating film 2 is formed to the thickness of about 400 nm, for example.

As the next step, the gate insulating film 3 is formed on the main surface of the active region of the p-type semiconductor substrate 1. The gate insulating film 3 is formed of, for example, a thermally oxidated silicon film by the thermal oxidation process. This gate insulating film 3 is formed to the thickness of about 12 nm, for example.

Figure 5A:
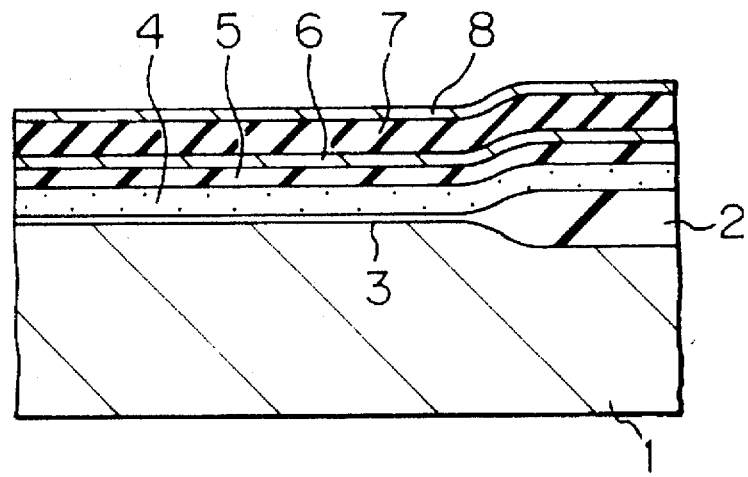
Figure 5B:
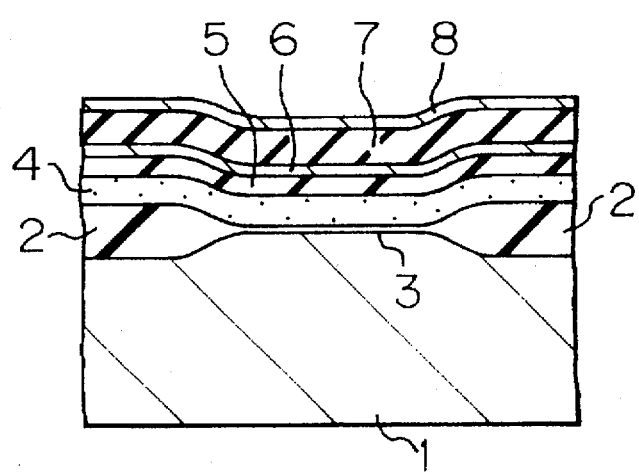
Figure 6:
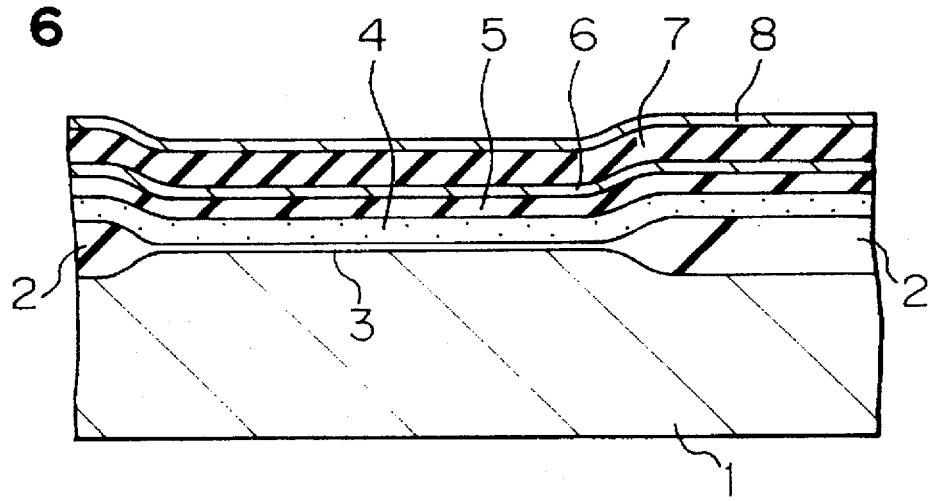

Then, as shown in FIGS. 5A, 5B and 6, a conductor film (gate material) 4, a second insulating film (insulating material) 5, a common electrode film (first electrode material) 6, a dielectric material film (ferroelectric material) 7 and a storage electrode film (second electrode material) 8 are formed sequentially over the whole surface of the substrate including the field insulating film 2 and the gate insulating film 3. The conductor film 4 is formed of, for example, a polycrystal silicon film deposited by the CVD process. Impurities for reducing the resistance value are doped into this polycrystal silicon film during or after deposition thereof. This conductor film 4 is formed to the thickness of about 150 nm, for example. The second insulating film 5 is formed of, for example, a silicon oxide film deposited by the CVD process in the thickness of about 100 nm. The common electrode film 6 and the storage electrode film 8 are formed of a Pt film deposited by sputtering, for example, in the thickness of about 50 nm. The dielectric material film 7 is formed of, for example, a ferroelectric material of lead zirconate titanate deposited by sputtering in the thickness of about 200 nm.

Figure 7A:
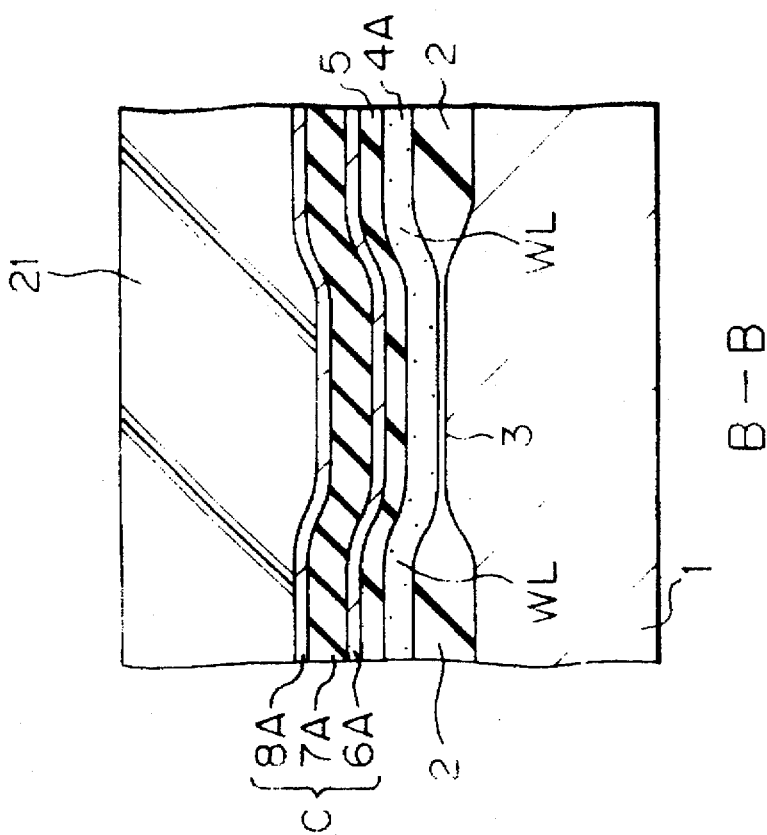
Figure 7B:
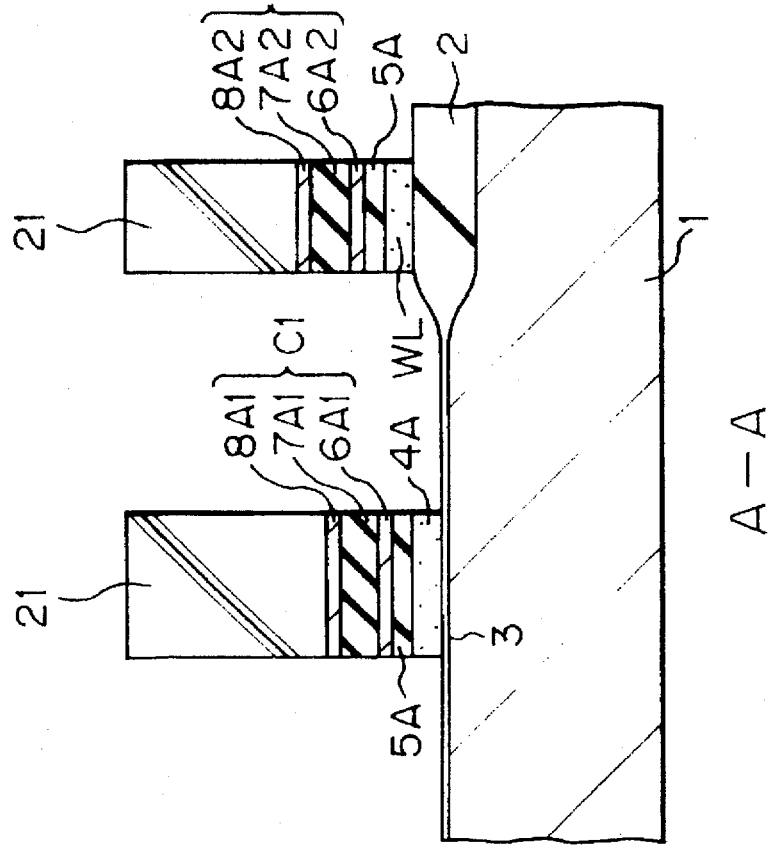
Figure 8:
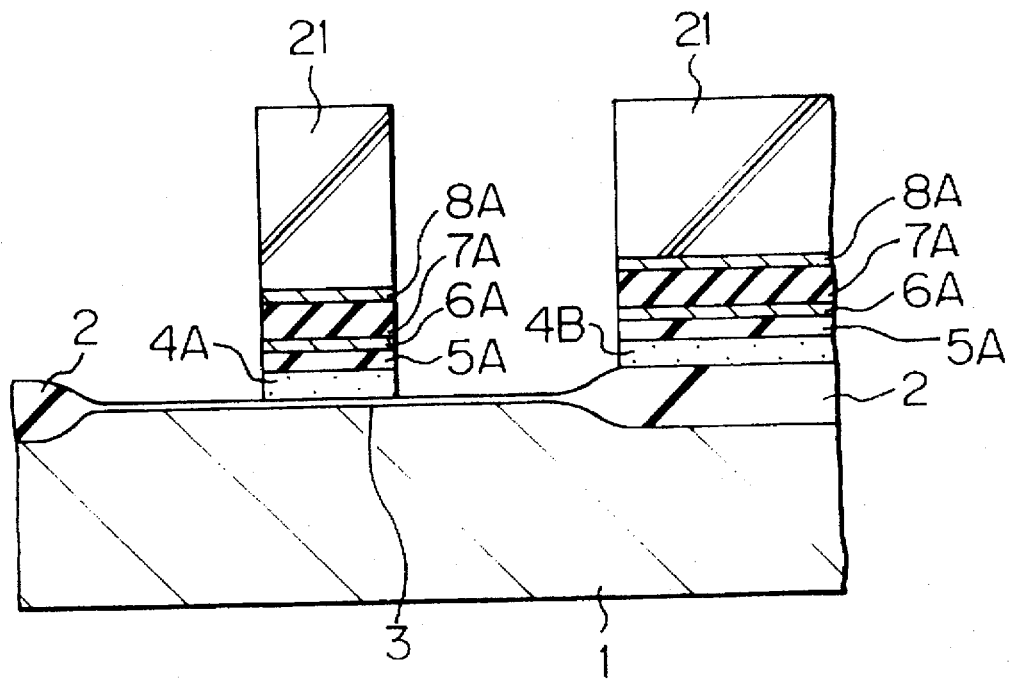

As shown in FIGS. 7A, 7B and 8, a mask 21 of stripe pattern is formed on the storage electrode film 8 to define the gate length in the active region of the p-type semiconductor substrate 1 and also to define the word line width in the non-active region of the p-type semiconductor substrate 1. This mask 21 is formed of, for example, a photoresist film by the photolithography.

As the next step, using the mask 21 as an etching mask, the storage electrode film 8, the dielectric material film 7, the common electrode film 6, the second insulating film 5 and the conductor film 4 are sequentially patterned. In this way, as shown in FIGS. 7A and 7B, the gate electrode 4A and the word line conductor WL are formed from the conductor film 4, the insulating film 5A from the second insulating film 5, the common electrodes 6A1, 6A2 from the common electrode film 6, and the dielectric film 7A from the dielectric material film 7. Thus the dimension along the direction of the data line conductor (substantially perpendicular to the word line conductor) of the storage electrode film 8 is defined, while at the same time forming the gate electrode 4A and the gate wiring conductor 4B from the conductor film 4, as shown in FIG. 8. The insulating film 5A, the common electrode 6A and the dielectric material film 7A are formed on the gate electrode 4A and the gate wiring conductor 4B in the peripheral circuit forming region, thereby defining the dimension along the data line of the storage electrode 8A. This patterning process is performed by anisotropic etching.

Then the mask 21 is removed.

Figure 10:
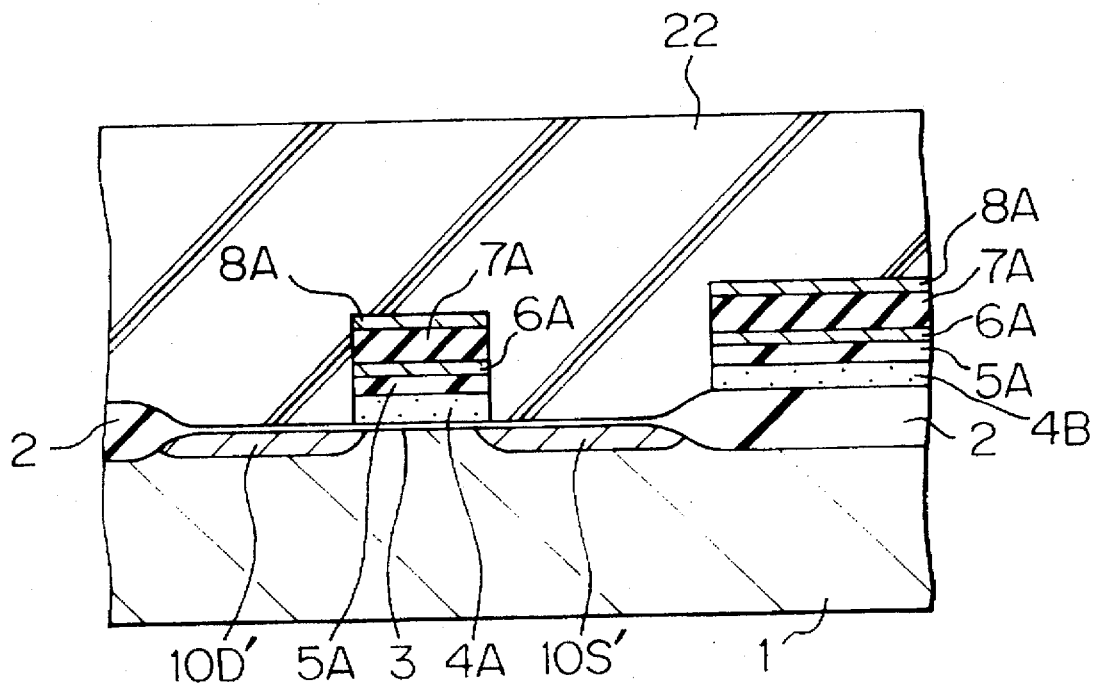

As shown in FIGS. 9A, 9B and 10, n-type impurities are doped by ion implantation into the main surface of the active region of the p-type semiconductor substrate 1 in the memory cell array forming region, thereby forming a pair of n-type semiconductors 10D, 10S used as the drain and the source respectively of the memory cell selecting MISFET Q. At the same time, a pair of n-type semiconductor regions 10D', 10S' used as the drain and the source respectively of the n-channel MISFET Qn are formed in the peripheral circuit forming region. In this process, the memory cell selecting MISEFT Q is formed.

Further, as shown in FIGS. 9A, 9B, 10, a mask 22 of stripe pattern for defining the length along the column (the direction in which the word line conductor WL extends) of the storage electrode 8A is formed over the entire surface of the substrate with a patterned storage electrode film 8 formed over the main surface thereof. This mask 22 is prepared from, for example, a photoresist film formed by photolithography.

As the next step, using the mask 22 as an etching mask, the patterned storage electrode film 8 is further patterned thereby to form storage electrodes 8A1, 8A2 with the length thereof defined along the column, as shown in FIG. 9B. This patterning process is performed by the anisotropic etching technique. In this patterning process, the dielectric films 7A1, 7A2 which have been patterned along the word line conductor may be patterned further along the data line conductor. In such a case, crosstalks can be prevented between the capacitor component C1 formed over the gate electrode 4A of the MISFET Q and the capacitor component C1 formed over the word line integrated with the gate electrode 4A. Also, the storage electrode 8A may be eliminated without forming the mask 22 in the peripheral circuit forming region shown in FIG. 10.

Then, the mask 22 is removed.

As the next step, as shown in FIGS. 11A, 11B, an insulating film 11 is formed, for example, by the CVD deposition, over the entire surface of the substrate with the storage electrodes 8A1, 8A2 formed over the main surface thereof. This insulating film 11 is formed in the thickness of, say, about 150 nm.

A mask 23 is then formed on the insulating film 11. This mask 23 is prepared from a photoresist film formed by photolithography, for example.

Using the mask 23 as an etching mask, the insulating film 11 is patterned. In this way, as shown in FIGS. 11A, 11B, an opening 11A is formed for exposing a part of the upper surface of the storage electrodes 8A1, 8A2 and the surface of the other n-type semiconductor region 10S of the memory cell selecting MISFET Q. Also, a side wall spacer 11B1 is formed to cover a side surface of the gate electrode 4A and a side surface of the common electrode 6A1 of the capacitor component C1, while at the same time forming a side wall spacer 11B2 for covering a side surface of the word line conductor WL and a side surface of the common electrode 6A2 of the capacitor component C2. The side surfaces where the side wall spacer 11B1 are formed are in opposed relationship to the side surfaces where the side wall spacer 11B2 are formed. This patterning process is performed by the anisotropic etching technique.

Then, the mask 23 is removed.

Figure 12B:
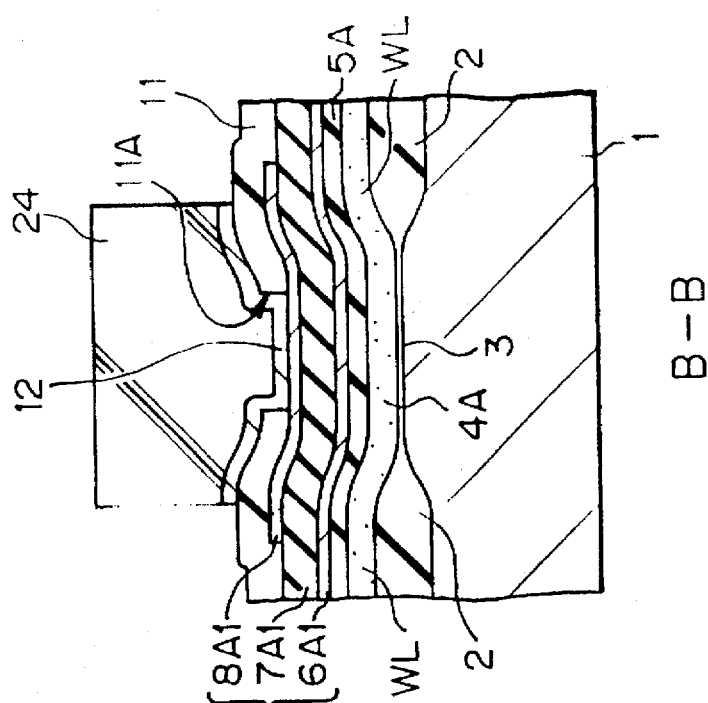
Figure 12A:
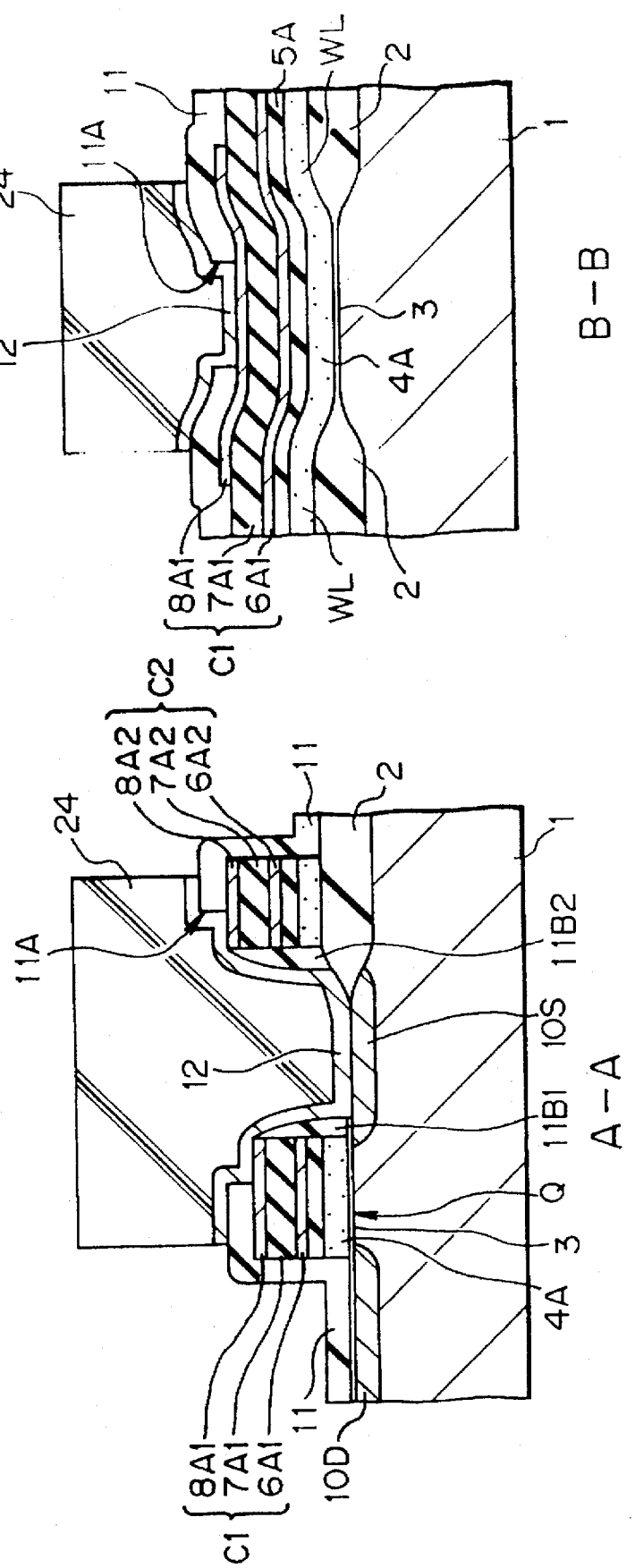

The next step forms a conductive film (12) by the reactive sputtering process, for example, on the insulating film 11 including the opening 11A, as shown in FIGS. 12A, 12B. This conductive film (12) is formed by a TiN film, for example, in the thickness of about 100 nm.

A mask 24 is formed on the conductive film (12). This mask 24 is formed as a photoresist film by photolithography, for example.

Using the mask 24 as an etching mask, the conductive film (12) is patterned, and as shown in FIGS. 12A, 12B, a connection electrode 12 is formed to electrically connect the storage electrodes 8A1, 8A2 and the n-type semiconductor region 10S. This patterning process is effected by the anisotropic etching technique. The side wall spacer 11B1 functions to isolate the gate electrode 4A and the common electrode 6A1 of the capacitor component C1 from the connection electrode 12. Similarly, the side wall spacer 11B2 has the function to isolate the word line conductor WL and the common electrode 6A2 of the capacitor component C2 from the connection electrode 12.

The mask 24 is removed.

Figure 13:
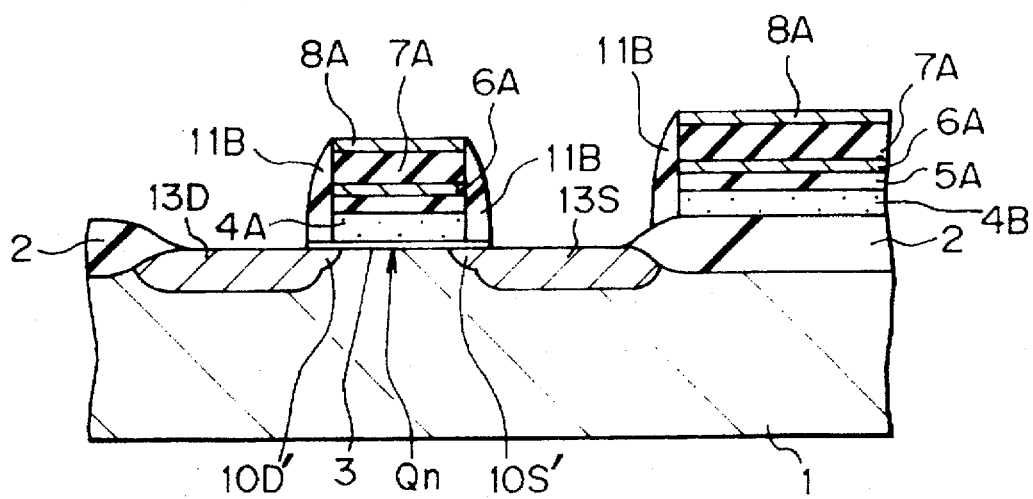

Then, as shown in FIG. 13, in the peripheral circuit forming region, a side wall spacer 11B for covering a side surface of the gate electrode 4A and a side surface of the electrode 6A is formed, while at the same time forming a side wall spacer 11B for covering a side surface of the gate wiring conductor 4B and a side surface of the electrode 6A.

As the next step, using the side wall spacer 11B and the field insulating film 2 as a mask, n-type impurities are doped into the main surface of the active region of the p-type semiconductor substrate 1. In this way, as shown in FIG. 13, n+-type semiconductor regions 13D, 13S are formed. This process forms an n-channel MISFET Qn.

Figure 15:
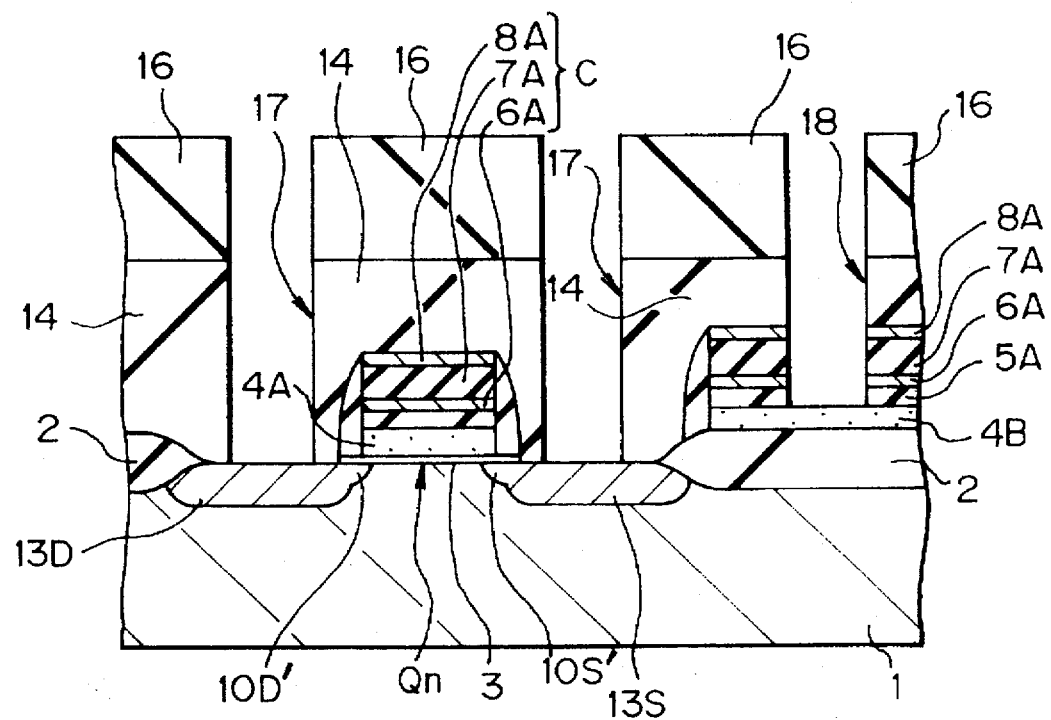
Figure 14B:
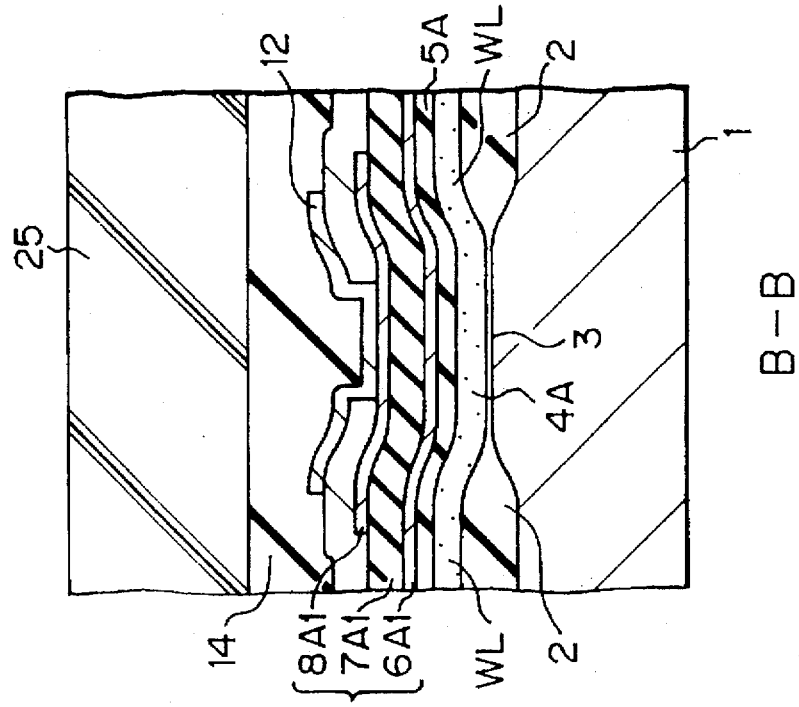
Figure 14A:
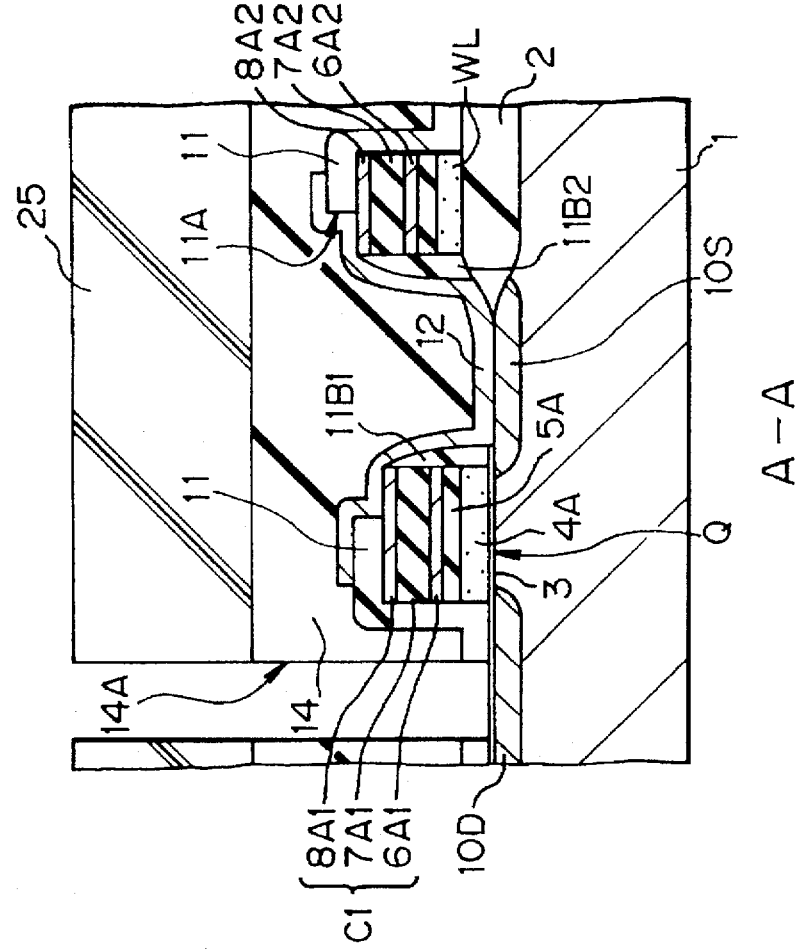

A layer insulating film 14 is formed over the entire surface of the p-type semiconductor substrate 1, as shown in FIGS. 14A, 14B and 15. This layer insulating film 14 is formed of, for example, a BPSG (Boro-Phospho-Silicate Glass) film.

The next step forms a mask 25 on the layer insulating film 14 in the memory cell array forming region, as shown in FIGS. 14A, 14B. This mask 25 is formed as a photoresist film by photolithography, for example.

Then, using the mask 25 as an etching mask, the layer insulating film 14 is patterned thereby to form a contact hole 14A.

The mask 25 is removed.

As the next step, a polycrystal silicon film 15A and a WSi film 15B are formed on the layer insulating film 14. The polycrystal silicon film 15A is formed in the thickness of, say, about 100 nm, and the WSi film in the thickness of, say, about 200 nm. Further, the polycrystal silicon film 15A and the WSi film 15B are patterned to form a data wire conductor DL as shown in FIG. 3. This patterning process is performed by the anisotropic etching technique.

Then, a layer insulating film 16 is formed to cover the data wire conductor DL.

The layer insulating film 16 is patterned to form a contact hole 17 and a contact hole 18 as shown in FIG. 15.

A W film (19) is then formed on the layer insulating film 16. After that, the W film (19) is patterned. In this way, as shown in FIG. 4, an upper level wiring conductor 19 is formed, thereby completing the essential parts of the DRAM according to the embodiment under consideration.

We claim:

1. A semiconductor memory device comprising:

a semiconductor substrate;

a plurality of word line conductors formed over said substrate and a plurality of data line conductors formed over said substrate generally perpendicularly to said word line conductors; and a plurality of memory cells each provided at an intersection between one of said word line conductors and one of said data line conductors and including a cell selecting transistor and an information storage capacitor, said transistor having a pair of semiconductor regions formed in a surface portion of said substrate and a control electrode formed over said surface portion of said substrate between said pair of semiconductor regions and integral with one of said word line conductors, wherein in each of said memory cells said capacitor includes a first capacitor component formed over said control electrode of the transistor and a second capacitor component formed over that one of said word line conductors which is adjacent to one of said word line conductors integral with said control electrode of the transistor, each of said first and second capacitor components having a common electrode, a storage electrode and a dielectric film sandwiched therebetween, wherein at least the storage electrodes of the capacitor components are physically separated from one another by a predetermined distance so as not to physically contact each other, the storage electrode being at a level higher than the common electrode in each of said first and second capacitor components, the storage electrodes of said first and second capacitor components being electrically connected with each other and with one of said semiconductor regions of the transistor, and the other semiconductor region of the transistor is electrically connected with one of said data line conductors.

2. A device according to claim 1, wherein said storage electrodes of the first and second capacitor components are connected to one another and to one of said semiconductor regions of the transistor through a connection electrode which commonly connects each of the storage electrodes of the first and second capacitors with said one of the semiconductor regions of the transistor.

3. A device according to claim 1, wherein said storage electrodes of the first and second capacitor components of each of said memory cells are electrically isolated from the storage electrodes of the first and second capacitor components of the others of said plurality of memory cells.

4. A semiconductor memory device comprising:

a semiconductor substrate;

a plurality of word line conductors formed over said substrate and a plurality of data line conductors formed over said substrate generally perpendicularly to said word line conductors; and a plurality of memory cells each provided at an intersection between one of said word line conductors and one of said data line conductors and including a cell selecting transistor and an information storage capacitor, said transistor having a pair of semiconductor regions formed in a surface portion of said substrate and a control electrode formed over said surface portion of said substrate between said pair of semiconductor regions and integral with one of said word line conductors, wherein in each of said memory cells said capacitor includes a first capacitor component formed over said control electrode of the transistor and a second capacitor component formed over that one of said word line conductors which is adjacent to the one of said word line conductors integral with said control electrode of the transistor, each of said first and second capacitor components having a common electrode, a storage electrode and a dielectric film sandwiched therebetween, the storage electrode being at a level higher than the common electrode in each of said first and second capacitor components, the storage electrodes of said first and second capacitor components being electrically connected with each other and with one of said semiconductor regions of the transistor, and the other semiconductor region of the transistor is electrically connected with one of said data line conductors, wherein in each of said memory cells, a first side wall spacer is provided to cover a side surface of said common electrode of said first capacitor component and a side surface of the control electrode of the transistor and a second side wall spacer is provided to cover a side surface of said common electrode of said second capacitor component and a side surface of said adjacent one word line conductor, said side surfaces covered by said first side wall spacer being opposed to said side surfaces covered by said second side wall spacer, and a connection electrode is provided for electrical connection of said storage electrodes of the first and second capacitor components with each other and with said one semiconductor region of the transistor in each of said memory cells, said connection electrode extending to overlie said one semiconductor region of the transistor, said first and second side wall spacers and said storage electrodes of said first and second capacitor components.

5. A device according to claim 4, wherein at least the storage electrodes of the first and second capacitor components are physically separated from one another by a predetermined distance so as not to physically contact each other.

6. A device according to claim 4, wherein said storage electrodes of the first and second capacitor components are connected to one another and to one of said semiconductor regions of the transistor through said connection electrode which commonly connects each of the storage electrodes of the first and second capacitors with said one of the semiconductor regions of the transistor.

7. A device according to claim 4, wherein said storage electrodes of the first and second capacitor components of each of said memory cells are electrically isolated from the storage electrodes of the first and second capacitor components of the others of said plurality of memory cells.

8. A semiconductor memory device comprising:

a semiconductor substrate;

a plurality of word line conductors formed over said substrate and a plurality of data line conductors formed over said substrate generally perpendicularly to said word line conductors; and a plurality of memory cells each provided at an intersection between one of said word line conductors and one of said data line conductors and including a cell selecting transistor and an information storage capacitor, said transistor having a pair of semiconductor regions formed in a surface portion of said substrate and a control electrode formed over said surface portion of said substrate between said pair of semiconductor regions and integral with one of said word line conductors, wherein in each of said memory cells said capacitor includes a first capacitor component formed over said control electrode of the transistor and a second capacitor component formed over that one of said word line conductors which is adjacent to the one of said word line conductors integral with said control electrode of the transistor, each of said first and second capacitor components having a common electrode, a storage electrode and a dielectric film sandwiched therebetween, the storage electrode being at a level higher than the common electrode in each of said first and second capacitor components, the storage electrodes of said first and second capacitor components being electrically connected with each other and with one of said semiconductor regions of the transistor, and the other semiconductor region of the transistor is electrically connected with one of said data line conductors, wherein the dielectric film of said first capacitor component in one of said memory cells has a width, as measured in a direction parallel with said data line conductors, substantially equal to a gate length of said gate electrode of the transistor of said memory cell, wherein the dielectric film of said second capacitor component in one of said memory cells has a width, as measured in the direction parallel with said data line conductors, substantially equal to a width of said adjacent one word line conductor, wherein the dielectric films of the first and second capacitor components are physically separated from one another by a predetermined distance so as not to physically contact each other.

9. A device according to claim 8, wherein said storage electrodes of the first and second capacitor components of each of said memory cells are electrically isolated from the storage electrodes of the first and second capacitor components of the others of said plurality of memory cells.

10. A device according to claim 8, wherein said dielectric film of each of said first and second capacitor components of each memory cell is made of a ferroelectric material.

11. A device according to claim 10, wherein said dielectric film is comprised of lead zirconate titanate.

12. A semiconductor memory device comprising:

a semiconductor substrate;

a plurality of word line conductors formed over said substrate and a plurality of data line conductors formed over said substrate generally perpendicularly to said word line conductors; and a plurality of memory cells each provided at an intersection between one of said word line conductors and one of said data line conductors and including a cell selecting transistor and an information storage capacitor, said transistor having a pair of semiconductor regions formed in a surface portion of said substrate and a control electrode formed over said surface portion of said substrate between said pair of semiconductor regions and integral with one of said word line conductors, wherein in each of said memory cells said capacitor includes a first capacitor component formed over said control electrode of the transistor and a second capacitor component formed over that one of said word line conductors which is adjacent to the one of said word line conductors integral with said control electrode of the transistor, each of said first and second capacitor components having a common electrode, a storage electrode and a dielectric film sandwiched therebetween, the storage electrode being at a level higher than the common electrode in each of said first and second capacitor components, the storage electrodes of said first and second capacitor components being electrically connected with each other and with one of said semiconductor regions of the transistor, and the other semiconductor region of the transistor is electrically connected with one of said data line conductors, wherein the storage and common electrodes and the dielectric film of said first capacitor component in one of said memory cells have a width, as measured in a direction parallel with said data line conductors, substantially equal to a gate length of said gate electrode of the transistor of said memory cell, and the storage and common electrodes and the dielectric film of said second capacitor component in one of said memory cells have a width, as measured in the direction parallel with said data line conductors substantially equal to that of said adjacent one word line conductor wherein at least the storage electrodes of the first and second capacitor components are physically separated from one another by a predetermined distance so as not to physically contact each other.

13. A semiconductor memory device comprising:

a semiconductor substrate;

a plurality of word line conductors formed over said substrate and a plurality of data line conductors formed over said substrate generally perpendicularly to said word line conductors; and a plurality of memory cells each provided at an intersection between one of said word line conductors and one of said data line conductors and including a cell selecting transistor and an information storage capacitor, said transistor having a pair of semiconductor regions formed in a surface portion of said substrate and a control electrode formed over said surface portion of said substrate between said pair of semiconductor regions and integral with one of said word line conductors, wherein in each of said memory cells said capacitor includes a first capacitor component formed over said control electrode of the transistor and a second capacitor component formed over that one of said word line conductors which is adjacent to the one of said word line conductors integral with said control electrode of the transistor, each of said first and second capacitor components having a common electrode, a storage electrode and a dielectric film sandwiched therebetween, the storage electrode being at a level higher than the common electrode in each of said first and second capacitor components, the storage electrodes of said first and second capacitor components being electrically connected with each other and with one of said semiconductor regions of the transistors, and the other semiconductor region of the transistor is electrically connected with one of said data line conductors, wherein the storage and common electrodes and the dielectric film of said first capacitor component in one of said memory cells have a width, as measured in a direction parallel with said data line conductors substantially equal to a gate length of said gate electrode of the transistor of said memory cell, and the storage and common electrodes and the dielectric film of said second capacitor component in one of said memory cells have a width, as measured in the direction parallel with said data line conductors, substantially equal to that of said adjacent one word line conductor, wherein said storage electrodes of the first and second capacitor components are connected to one another and to one of said semiconductor regions of the transistor through a connection electrode which commonly connects each of the storage electrodes of the first and second capacitors with said one of the semiconductor regions of the transistor.

* * * * *